(12) United States Patent
Rapp

(10) Patent No.: US 6,373,328 B2
(45) Date of Patent: Apr. 16, 2002

(54) COMPARATOR CIRCUIT

(75) Inventor: Karl Rapp, Los Gatos, CA (US)

(73) Assignee: Fairchild Semiconductor Corporation, South Portland, MI (US)

( * ) Notice: Subject to any disclaimer, the term of this patent is extended or adjusted under 35 U.S.C. 154(b) by 0 days.

(21) Appl. No.: 09/759,817

(22) Filed: Jan. 10, 2001

Related U.S. Application Data

(62) Division of application No. 09/218,107, filed on Dec. 21, 1998.

(51) Int. Cl.[7] .................................................. G05F 1/10
(52) U.S. Cl. ......................... 327/536; 327/544; 327/77
(58) Field of Search .............................. 327/77, 63, 65, 327/66, 80, 81, 89, 72, 75, 74, 90, 143, 544, 545, 536

(56) References Cited

U.S. PATENT DOCUMENTS

| | | | |
|---|---|---|---|
| 4,959,816 A | 9/1990 | Iwahashi et al. | 365/233.5 |
| 5,126,590 A | 6/1992 | Chern | 327/536 |
| 5,184,030 A | 2/1993 | Chung et al. | 327/530 |
| 5,351,217 A | 9/1994 | Jeon | 365/230.06 |
| 5,394,026 A | 2/1995 | Yu et al. | 327/536 |
| 5,453,680 A | 9/1995 | Giolma et al. | 323/315 |
| 5,546,031 A | 8/1996 | Seesink | 327/155 |
| 5,561,385 A | 10/1996 | Choi | 327/536 |
| 5,583,425 A * | 12/1996 | Rapp et al. | 327/109 |
| 5,592,115 A | 1/1997 | Kassapian | 327/239 |
| 5,686,823 A * | 11/1997 | Rapp | 323/313 |
| 5,694,072 A | 12/1997 | Hsiao et al. | 327/537 |
| 5,945,852 A * | 8/1999 | Kosiec | 327/68 |
| 6,011,447 A | 1/2000 | Iwasaki | 331/185 |
| 6,016,081 A | 1/2000 | O'Shaughnessy | 331/48 |
| 6,028,458 A * | 2/2000 | Hamaguchi | 327/89 |
| 6,127,854 A * | 10/2000 | Illegems | 327/66 |
| 6,147,549 A | 11/2000 | Ohno | 327/541 |
| 6,204,723 B1 | 3/2001 | Houghton et al. | 327/540 |
| 6,215,361 B1 | 4/2001 | Lebouleux et al. | 331/17 |

FOREIGN PATENT DOCUMENTS

| | | | |
|---|---|---|---|
| EP | 323 156 A2 | 12/1988 | G11C/17/00 |
| EP | 350 462 A3 | 6/1989 | H02M/3/07 |
| EP | 350 462 B1 | 6/1989 | H02M/3/07 |
| EP | 350 462 A2 | 6/1989 | H02M/3/07 |
| GB | 2 035 629 A | 11/1979 | |
| JP | 60-69895 | 4/1985 | |

* cited by examiner

Primary Examiner—Kenneth B. Wells
Assistant Examiner—Linh Nguyen
(74) Attorney, Agent, or Firm—Skjerven Morrill MacPherson

(57) ABSTRACT

A charge pump system includes a charge pumping circuit for outputting a high voltage $V_{PP}$ at a node. An oscillator circuit, coupled to the charge pumping circuit, drives the charge pumping circuit with at least one clock signal. A current source generates a pulldown current. A voltage divider circuit is coupled between the node and the current source. The voltage divider circuit cooperates with the current source to form a feedback loop for controlling the oscillator circuit to run at variable, optimum frequency for controlling the rate-of-rise and the amplitude of the high voltage $V_{PP}$ while minimizing power-supply current drain.

22 Claims, 5 Drawing Sheets

COMPARATOR CIRCUIT

CROSS-REFERENCE TO RELATED PATENTS AND APPLICATIONS

This application is a divisional of U.S. patent application Ser. No. 09/218,107, filed Dec. 21, 1998, entitled "Low-Current Charge Pump System."

TECHNICAL FIELD OF THE INVENTION

This invention relates generally to the field of charge pumps, and more particularly, to a comparative circuit.

This application relates to the subject matter disclosed in the following United States Patents Applications:

U.S. patent application Ser. No. 09/760,071, entitled "Voltage Divider Circuit," filed Jan. 10, 2001; and U.S. patent application Ser. No. 09/760,108, entitled "Oscillator Circuit," filed Jan. 10, 2001.

The above patents are assigned to the present Assignee and are incorporated herein by reference.

BACKGROUND OF THE INVENTION

Many integrated circuit (IC) devices, such as non-volatile memories, include a high-voltage generator for generating a voltage ($V_{PP}$) having a value greater than the supply voltage ($V_{DD}$). According to previously developed techniques, such a high voltage generator typically employs a charge pump driven by a free-running oscillator in conjunction with a voltage regulator. The oscillator may be implemented as a closed ring of an odd-number (e.g., seven or nine) of inverter stages. The voltage regulator limits the maximum voltage value for $V_{PP}$ by comparing it—for example, via a resistance voltage divider circuit—to a fixed reference voltage. When the divider voltage exceeds the reference voltage, a shunt-$I_{PP}$ current path is established to pull down $V_{PP}$ until the comparator balance of the voltage regulator is satisfied.

Such previously developed techniques utilizing current-shunting to regulate $V_{PP}$ are generally wasteful and inefficient. For example, although it is often desirable to have a rise time for $V_{PP}$ in the range of tens to hundreds of microseconds, the current shunting technique relies on shunting away pump current in excess of that required to charge load capacitance at the desired rate. In addition, the oscillator used to drive the charge pump expends large amounts of voltage supply current $I_{DD}$ (typically in the range of 2–5 mA), converting it to pump-output current $I_{PP}$, usually at very low efficiency ($I_{PP}/I_{DD}$). Furthermore, because the time delay of the inverter ring of a typical oscillator is designed to produce the minimum frequency necessary for the charge pump to reach the desired $V_{PP}$ under all possible conditions for voltage, temperature, and process, this minimum frequency is generally set to a value sufficiently high (e.g., in the range of 2–15 MHz) to ensure adequate control by the shunt regulator. For many sets of conditions, however, this minimum frequency produces current greatly in excess of functional circuit requirements, drawing higher supply current than is necessary.

SUMMARY

The disadvantages and problems associated with previously developed techniques for generating and regulating the output of a high voltage generator have been substantially reduced or eliminated using the present invention.

According to one embodiment of the present invention, a charge pump system includes a charge pumping circuit for outputting a high voltage $V_{PP}$ at a node. An oscillator circuit, coupled to the charge pumping circuit, drives the charge pumping circuit with at least one clock signal. A current source generates a pulldown current. A capacitor voltage divider circuit is coupled between the node and the current source. The voltage divider circuit cooperates with the current source to form a feedback loop for controlling the oscillator circuit to run at variable, optimum frequency for controlling the rate-of-rise and the amplitude of the high voltage $V_{PP}$.

According to another embodiment of the present invention, an oscillator circuit includes a current mirror which receives a control signal and generates an output current signal in response. An inverter is coupled to the current mirror. A capacitor receives the output current signal of the current mirror through the inverter. A NOR gate receives the voltage developed across the capacitor and generates a clock signal.

According to yet another embodiment of the present invention, a voltage divider circuit includes a first capacitor coupled to a first node at which a high voltage $V_{PP}$ appears. A second capacitor is coupled in series to the first capacitor at a second node, and a third capacitor is coupled in series to the second capacitor at a third node. A source follower, coupled to the second node, translates a voltage at the second node to a voltage having a value of approximately one-half $V_{PP}$.

According to still yet another embodiment of the present invention, a comparator circuit includes a first source follower which follows a supply voltage $V_{DD}$. A second source follower follows a high voltage $V_{PP}$. A current mirror is coupled to the first and second source followers. The current mirror pulls the voltage at a node to a first value if the high voltage $V_{PP}$ is approximately equal to the supply voltage $V_{DD}$, and pulls the voltage at the node to a second value if the high voltage $V_{PP}$ is greater than the supply voltage $V_{DD}$, thereby comparing the high voltage $V_{PP}$ to the supply voltage $V_{DD}$ without drawing current from the high voltage $V_{PP}$.

A technical advantage of the present invention includes providing a charge pump system which outputs a $V_{PP}$ with high voltage value and yet requires a minimal amount of supply current ($I_{DD}$) (e.g., less than 50 uA).

Other aspects and advantages of the present invention will become apparent from the following descriptions and accompanying drawings.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE PREFERRED EMBODIMENTS

Figure 1:
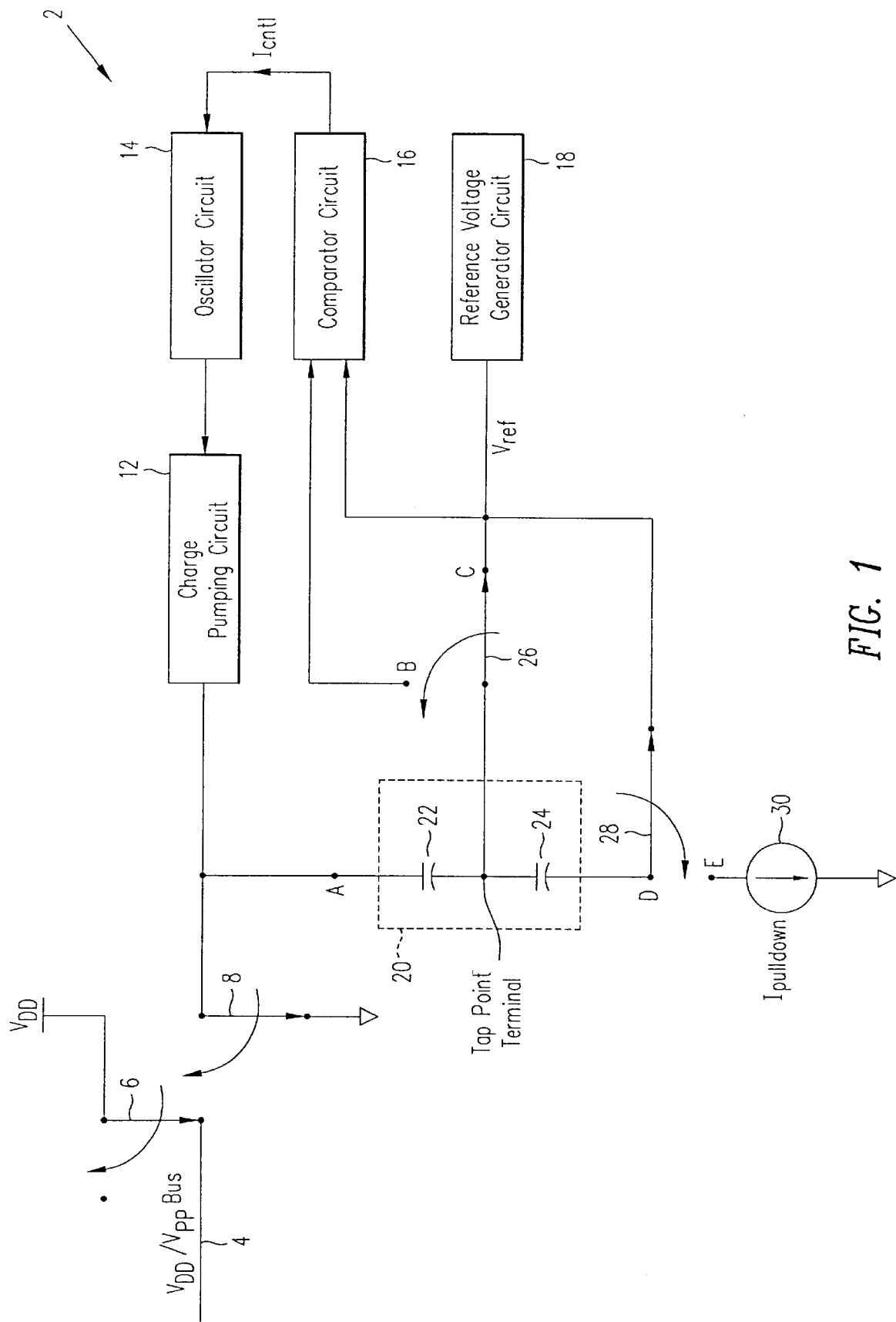
FIG. 1 is a schematic diagram in partial block form of a low-current charge pump system, in accordance with an embodiment of the present invention.

The preferred embodiments of the present invention and their advantages are best understood by referring to FIGS. 1 through 5 of the drawings. Like numerals are used for like and corresponding parts of the various drawings.

With the present invention, a charge pump system outputs a $V_{PP}$ with high voltage value and yet requires a total supply current ($I_{DD}$) of less than 50 uA. Approximately one-half of this current may be used for a reference voltage generator circuit (described below). Hence, the average current used for the oscillator circuit is less than 25 uA, which is substantially less (e.g., by a factor of 100) than with previously developed techniques.

To achieve this large reduction in current, the present invention utilizes one or more of the following strategies: (1) minimizing the number of moving nodes in the charge pump system, (2) minimizing the rate at which the voltage potential of the moving nodes changes, and (3) having no static current drain on the $V_{PP}$ which is generated.

The first and second strategies minimize dynamic supply-current drain. In general, dynamic supply current ($I_{dynamic}$) is proportional to the total capacitance (C) being charged/discharged in the charge pump system, the charging voltage (V) which is typically supply voltage $V_{DD}$, and the frequency (f) at which the current changes. In particular, the value for dynamic supply-current is given by the following equation:

$$I_{dynamic} = CVf.$$

To implement the first strategy, in one embodiment of the present invention, a charge pump system incorporates an oscillator circuit which is designed to minimize the number of moving nodes in the charge pump system. The oscillator circuit is generally the main source of $V_{DD}$ dynamic-current drain in a charge pump system.

To implement the second strategy, in another embodiment of the present invention, a charge pump system incorporates a feedback loop. The feedback loop is used to control the frequency of a clock signal fed into a charge pumping circuit which outputs voltage $V_{PP}$. The frequency of the clock signal is optimized during risetime of $V_{PP}$ and goes to zero once a desired voltage level for $V_{PP}$ is reached. The feedback loop comprises a number of different elements, the parameters for which are selected to produce the optimal frequency.

To implement the third strategy, in yet another embodiment of the present invention, a charge pump system incorporates a voltage divider circuit having a source follower powered by $V_{PP}$. The source follower outputs a voltage having a value of approximately one-half $V_{PP}$ on a corresponding bus. The half-$V_{PP}$ bus is arranged to be pulled to ground when the charge pump system is not active. Accordingly, no pulldown is required for the source follower, and hence this circuit draws no current from $V_{PP}$. Thus, a voltage of one-half $V_{PP}$ is made available with no current drain on $V_{PP}$.

Each of these embodiments for implementing the three strategies are described below in more detail.

Charge Pump System

FIG. 1 is a schematic diagram in partial block form of a low-current charge pump system 2, in accordance with an embodiment of the present invention. Charge pump system 2 can be incorporated into an IC device, such as an electrically erasable programmable read-only memory (EEPROM). Charge pump system 2 generally functions to generate a voltage $V_{PP}$ that is higher than a supply voltage $V_{DD}$. If charge pump system is incorporated into an EEPROM, voltage $V_{DD}$ is used during normal operation, and voltage $V_{PP}$ can be used during actual programming.

Voltage $V_{PP}$ appears at a node A and may have a value of approximately 16V. Voltages $V_{PP}$ and $V_{DD}$ can be alternatively placed on a voltage $V_{DD}/V_{PP}$ bus 4. In particular, a switch 6 is operable to connect voltage $V_{DD}$ to $V_{DD}/V_{PP}$ bus 4, and a switch 8 is operable to connect voltage $V_{PP}$ to $V_{DD}/V_{PP}$ bus 4.

Charge pump system 2 includes a charge pumping circuit 12 which outputs voltage $V_{PP}$. Charge pumping circuit 12 may comprise a series of rectifying devices and, in one embodiment, can be implemented with capacitors and diode-connected transistors according to a conventional technique.

An oscillator circuit 14 is coupled to charge pumping circuit 12. As used herein, the terms "connected," "coupled," or any variant thereof, means any connection or coupling, either direct or indirect, between two or more elements. Oscillator circuit 14 generally functions to drive charge pumping circuit 12. In particular, oscillator circuit 14 may generate two non-overlapping, oscillating clock signals $\Phi_1$ and $\Phi_2$, each of which has a corresponding frequency and may comprise a square wave signal. Clock signals $\Phi_1$ and $\Phi_2$ are input into charge pumping circuit 12 to alternately apply voltages across the diode-connected transistors contained therein, thus pumping charge through the rectifying elements; this causes the voltage at node A to rise to the $V_{PP}$ voltage level. The rate at which $V_{PP}$ can be generated is directly proportional to the frequency of clock signals $\Phi_1$ and $\Phi_2$.

A comparator circuit 16 is coupled to oscillator circuit 14. Comparator circuit 16 functions to compare a scaled-down version of the $V_{PP}$ voltage against a reference voltage ($V_{ref}$) described below. These voltages may be applied at nodes B and C, respectively, which are connected to the input terminals of comparator circuit 16. Comparator circuit 16 generates a control current $I_{CNTL}$ signal, the value of which is proportional in magnitude to the difference between the reference voltage and the scaled-down $V_{PP}$ voltage and which decreases to zero when the two voltages are equal. Control current $I_{CNTL}$ signal is input into oscillator circuit 14 and establishes the frequency of clock signals $\Phi_1$ and $\Phi_2$ output by oscillator circuit 14. In one embodiment, comparator circuit 16 can be implemented as the circuit shown and described in U.S. Pat. No. 5,583,425, entitled "Voltage Comparator With Controlled Output Current Proportional To Difference Voltage," which is incorporated herein by reference.

A reference voltage generator circuit 18 is coupled to one of the input terminals of comparator circuit 16 at node C. Reference voltage generator circuit 18 generates the reference voltage ($V_{ref}$) against which the scaled-down version of $V_{PP}$ voltage is compared. The value of the reference voltage is preferably constant. In one embodiment, reference voltage generator circuit 18 can be implemented as the bandgap reference voltage generator shown and described in U.S. Pat. No. 5,686,823, entitled "Bandgap Voltage Reference Circuit," which is incorporated herein by reference. Alternatively, reference voltage generator circuit 18 can be implemented according to conventional techniques well-known to those skilled in the art.

A voltage divider circuit 20 divides the voltage at node A. One result of such division is the scaled-down $V_{PP}$ voltage. Voltage divider circuit 20 comprises a first capacitor 22 and a second capacitor 24 which have respective values of "C1"

and "C2." Capacitors 22 and 24 are connected in series between node A and a node D. A top terminal of voltage divider circuit 20 is coupled to the output terminal of charge pumping circuit 12 at node A. A tap-point terminal of voltage divider circuit 20 lies between capacitors 22 and 24. The scaled-down $V_{PP}$ voltage appears at the tap-point terminal, and its voltage value is related to the values C1 and C2 of capacitors 22 and 24, respectively. A bottom terminal of voltage divider circuit 20 is located at node D.

A switch 26 switchably connects the tap-point terminal of voltage divider circuit 20 between nodes B and C, thereby alternately coupling the tap-point terminal to one input terminal of comparator circuit 16 and the output terminal of reference voltage generator circuit 18 (which coincides with the other input terminal of comparator circuit 16). A switch 28 switchably connects the bottom terminal of voltage divider circuit 20, which coincides with node D, between node C and a node E. This alternately couples the bottom terminal of voltage divider circuit 20 to the output terminal of reference voltage generator circuit 18 (one input terminal of comparator circuit 16) and a current source 30 (described below).

Current source 30 has an input terminal at node E which is switchably connected to voltage divider circuit 20. Current source 30 generates a pulldown current $I_{pulldown}$ which functions to pull down the bottom terminal of voltage divider circuit 20.

Collectively, current source 30 and voltage divider circuit 20 support a feed-back loop for charge pump system 2. The values C1 and C2 of capacitors 22 and 24, respectively, in voltage divider circuit 20 can be selected so that the feedback loop causes $V_{PP}$ to rise at the desired rate and to be limited to the desired amplitude by nullifying the tendency of the tap-point terminal to move. In other words, both the rate of rise of $V_{PP}$ and the final value of $V_{PP}$ can be controlled by the parameters of capacitors 22 and 24, current source 30, and the value of $V_{ref}$, as described below in more detail.

In operation, charge pump system 2 is kept in a standby position until the high voltage $V_{PP}$ is needed. In standby position, switch 6 connects voltage source $V_{DD}$ to $V_{DD}/V_{PP}$ bus 4 (so that voltage value $V_{DD}$ appears on the bus), and switch 8 connects node A to ground (GND). Furthermore, switch 26 connects the tap-point terminal of voltage divider circuit 20 to node C, and switch 28 connects the bottom terminal of voltage divider circuit 20 also to node C. Capacitor 24 has no charge because both of its terminals are at reference voltage $V_{ref}$.

Charge pump system 2 does not generate the high voltage $V_{PP}$ until such voltage is needed. For example, if charge pump system 2 is incorporated into an EEPROM, high voltage $V_{PP}$ would be needed for programming.

When the high voltage $V_{PP}$ is required, charge pump system 2 is activated, and switch 6 is moved to disconnect voltage source $V_{DD}$ from $V_{DD}/V_{PP}$ bus 4, and switch 8 is moved to connect node A to the bus. Switch 26 is moved to connect the tap-point terminal of voltage divider circuit 20 to node B, and switch 28 is moved to connect the bottom terminal of circuit 20 to current source 30.

Both the tap-point terminal and the bottom terminal of voltage divider circuit 20, initially held in standby position at the fixed reference-voltage potential $V_{ref}$, are released. Current source 30 generates $I_{pulldown}$ which proceeds to pull the voltage at the bottom terminal toward ground potential. As the voltage at the bottom terminal is pulled down, the voltage at the tap point terminal attempts to follow, thus unbalancing comparator circuit 16 which compares the voltage at the tap-point terminal with the fixed reference potential $V_{ref}$. Comparator circuit 16 outputs current $I_{CNTL}$, which is proportional in magnitude to the difference between the voltages of the tap-point terminal and $V_{ref}$ and decreases to zero at balance. $I_{CNTL}$ establishes the frequency of oscillator circuit 14 which begins to drive charge pumping circuit 12. In response, charge pumping circuit 12 starts to raise $V_{PP}$. That is, charge pumping circuit 12 begins to pump up the voltage at node A.

As charge pumping circuit 12 starts, the top terminal of voltage divider circuit 20 (connected to the output of the charge pumping circuit 12) rises from ground potential. As $I_{pulldown}$ proceeds to pull down the bottom terminal of voltage divider circuit 20, the voltage at the tap point terminal attempts to follow. The change in $V_{PP}$, coupling through capacitor 22 of voltage divider circuit 20, tends to cancel the movement of the tap point terminal. The feedback loop (supported by voltage divider circuit 20 and current source 30) causes the $V_{PP}$ ramp rate to proportionally follow the rate of descent of the bottom terminal. When the bottom terminal reaches ground, $V_{PP}$ stops rising. Since the change in charge of the top capacitor 22 must equal the change in the bottom capacitor 24, the $V_{PP}$ level is set by the value $(C1/C2)*V_{ref}$. The $V_{PP}$ rise time, which is equal to the time for the bottom terminal to reach ground, is thus set by the value $C2*V_{ref}/I_{pulldown}$. Accordingly, charge pump system 2 can be designed with suitable values for C2, $V_{ref}$, and $I_{pulldown}$ so that $V_{PP}$ rises at a desired ramp rate.

Because of the feedback configuration, oscillator circuit 14 is controlled to run at the minimum frequency for clock signals $\Phi_1$ and $\Phi_2$ needed to sustain the ramp (typically less than 100 kHz), thus minimizing dynamic current drain. When $V_{PP}$ stabilizes, oscillator circuit 14 stops completely, then briefly turns on only occasionally to accommodate any leakage current drawn from $V_{PP}$.

To achieve the desired ramp rates, the required ratio of C2 to $I_{pulldown}$ may be quite high. That is, because practical minimum values for controllable currents in IC devices lie in the range of 10–100 nA, capacitor 24 ordinarily would be required to be quite large (e.g., 200–300 pF). However, in accordance with an embodiment of the present invention, current source 30 may be controlled with duty-cycle so that the size of capacitor 24 may be reduced. Specifically, by using a periodic control with duty cycle (D) for $I_{pulldown}$, the value of C2 can be decreased by a factor of D.

Charge Pumping Circuit

Figure 2:
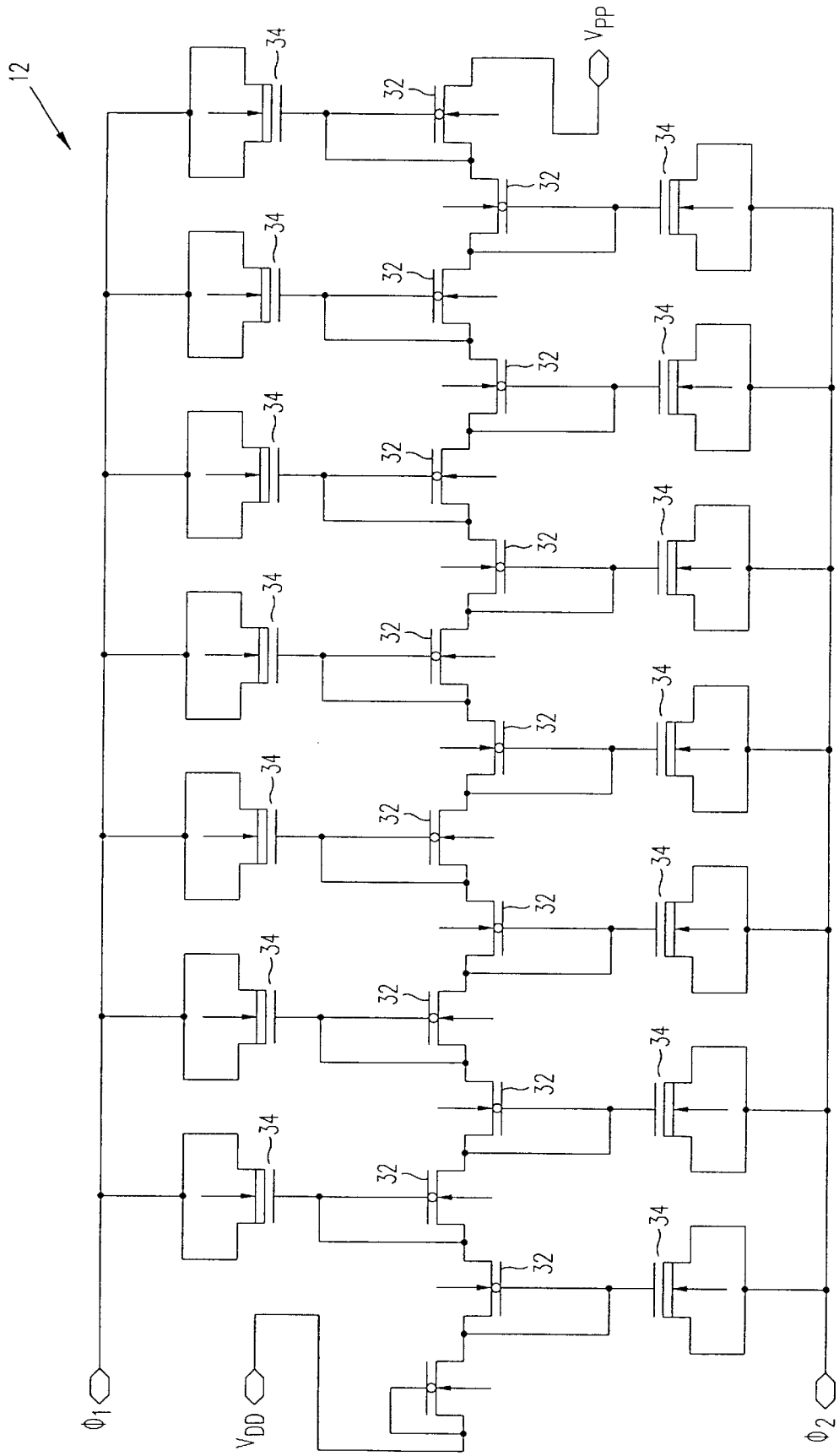
FIG. 2 is a schematic diagram of an exemplary embodiment for a charge pumping circuit.

FIG. 2 is a schematic diagram of an exemplary embodiment for charge pumping circuit 12 shown in FIG. 1. As shown, charge pumping circuit 12 comprises a series of n-type transistors 32 coupled between $V_{DD}$ and $V_{PP}$. The gate of each of transistors 32 is coupled to the drain of the same transistor 32 and also to the gate of a separate n-type transistor 34. The source and drain of each transistor 34 is coupled to oscillator circuit 14 and receives either the $\Phi_1$ or $\Phi_2$ clock signal. With this arrangement, charge pumping circuit 12 comprises a series of rectifying devices which pump up the voltages of the nodes between $V_{DD}$ and $V_{PP}$ along the series comprising transistors 32.

Oscillator Circuit

Figure 3:
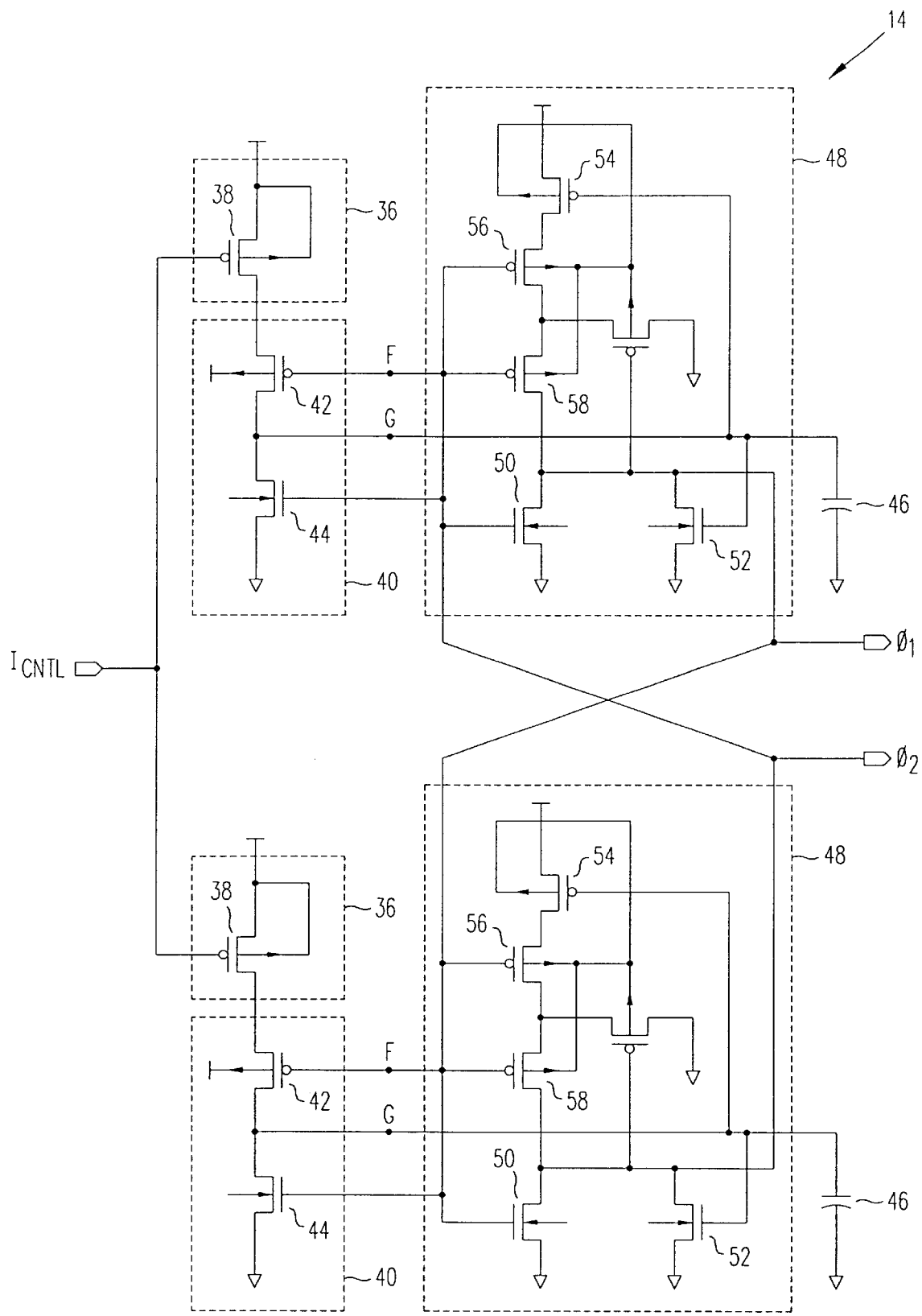
FIG. 3 is a schematic diagram of an exemplary embodiment for an oscillator circuit, in accordance with an embodiment of the present invention.

FIG. 3 is a schematic diagram of an exemplary embodiment for oscillator circuit 14, in accordance with an embodiment of the present invention. Oscillator circuit 14 generates two non-overlapping, oscillating clock signals $\Phi_1$ and $\Phi_2$.

As depicted, oscillator circuit 14 comprises two current mirrors 36. Current mirrors 36 reflect the current $I_{CNTL}$ which is output by comparator circuit 16 (FIG. 1) and directly proportional to the difference between $V_{ref}$ and the scaled-down $V_{PP}$ voltage. Each current mirror 36 comprises a p-type transistor 38 which receives the $I_{CNTL}$ mirror voltage at its gate. Each current mirror 36 outputs a respective output current signal.

A separate inverter 40 is coupled to a respective current mirror 36. Each inverter 40 comprises a p-type transistor 42 and an n-type transistor 44, the gates of which are coupled together at a respective node F. The output of each inverter 40 is coupled to a respective capacitor 46 at a respective node G. The values for capacitors 46, in conjunction with the values of the reflected $I_{CNTL}$ currents, can be selected to provide a desired timing for the $\Phi_1$ and $\Phi_2$ clock signals.

A separate NOR gate 48 receives the output current signal from a respective current mirror 36 through a respective inverter 40; with this arrangement, each current mirror 36 controls the amount of current delivered to the respective capacitor 46, thus defining the voltage at the input of NOR gate 48. The gates of transistors 42 and 44 in each inverter 40 are coupled to the respective NOR gates 48 at the respective node F. The output of each NOR gate 48 appears at the respective node F of the other NOR gate 48. The output of one of NOR gates 48 is the $\Phi_1$ clock signal, and output of the other NOR gate 48 is the $\Phi_2$ clock signal.

Each NOR gate 48 comprises a first n-type transistor 50 and a second n-type transistor 52. If the voltage appearing at the gate of either of these transistors 50 or 52 is high, the value of the respective output clock signal is pulled low. For each NOR gate 48, a series of p-type transistors 54, 56, and 58 pull up the voltage value of the respective output clock signal.

With transistors 54, 56, and 58 connected as shown, hysteresis is created at nodes F. With this hysteresis, the trip point for each inverter 40 will differ depending on whether the voltage at the respective node F is increasing or decreasing. As such, each inverter 40 functions as a Schmitt trigger in which the output voltage level is binary, is determined by the magnitude of the input signal, and is independent of the input signal waveform. This provides stability against noise.

The design for oscillator circuit 14 described herein minimizes the number of moving nodes in charge pump system 2, thereby conserving dynamic current (the value of which is given by the equation "$I_{dynamic}=CVf$" as described above). Specifically, functioning as Schmitt triggers, inverters 40 monitor the voltages developed across timing capacitors 46, which are alternately charged by a current proportional to $I_{CNTL}$ (provided by comparator circuit 16 shown in FIG. 1). Inverters 40 control the charging sequence, discharging one capacitor 46 while simultaneously monitoring the rising voltage on the other. When the rising voltage reaches the trip point for the Schmitt trigger, such inverter 40 switches and the two charging circuits change roles. The timing capacitors 46 can be made very small so that the current reflected from the frequency-control current $I_{CNTL}$ from comparator circuit 16 can be minimized.

In this embodiment, oscillator circuit 14 carries out an oscillating operation by feeding back the outputs of inverters 40 with respective capacitors 46, thereby inverting the input signals to the same inverters. When the signals pass through the inverters 40, the timing is controlled so as to vary the oscillation frequency. That is, if the signal transmission time of an inverter 40 is extended, then the frequency of the respective clock signal ($\Phi_1$ or $\Phi_2$) is decreased, while if the signal transmission time is shortened, the frequency is increased.

Voltage Divider Circuit

Figure 4:
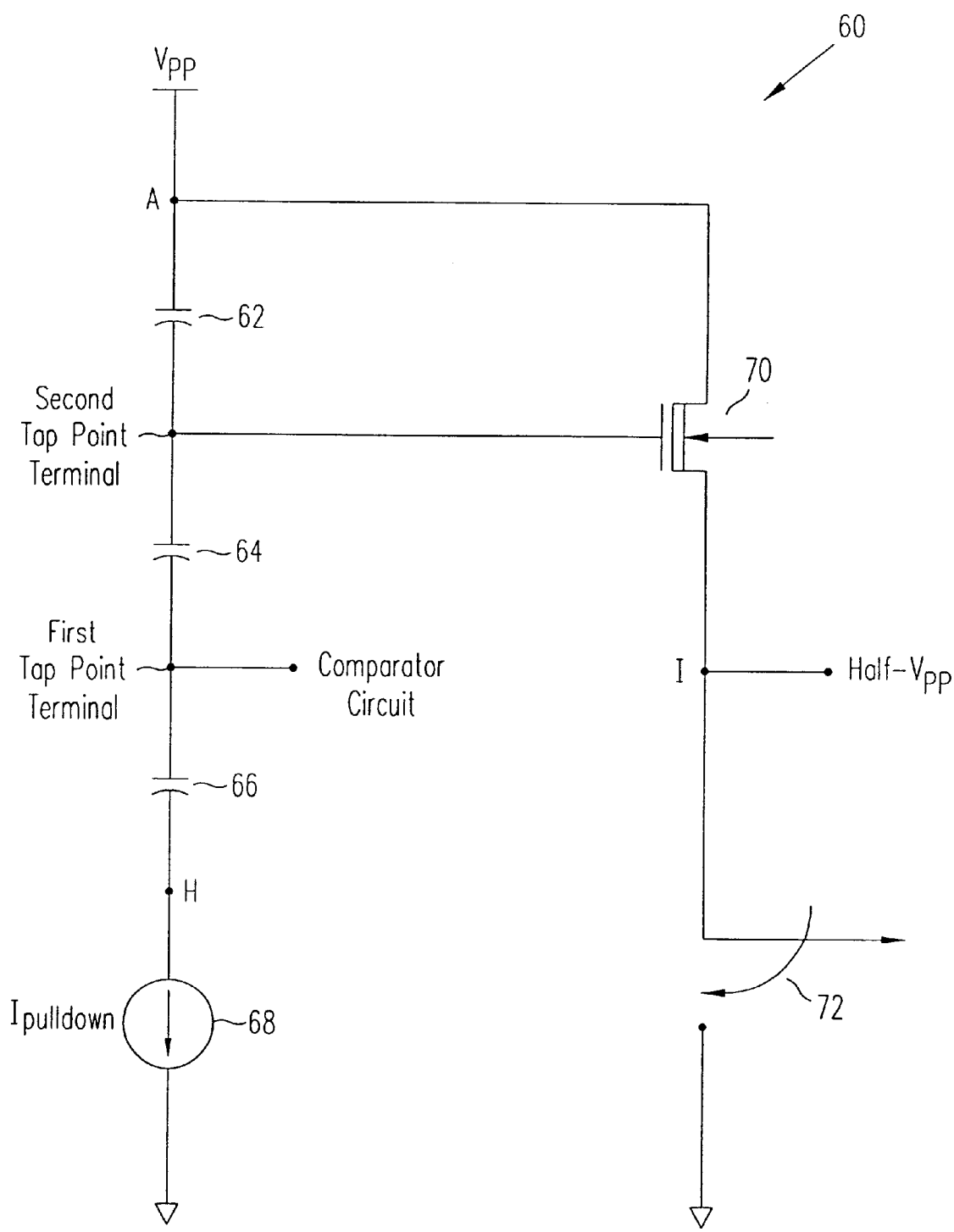
FIG. 4 is a schematic diagram of a voltage divider circuit, in accordance with an embodiment of the present invention.

FIG. 4 is a schematic diagram of circuit for an alternative voltage divider circuit 60, in accordance with another embodiment of the present invention. Voltage divider circuit 60 can be used as an alternative to voltage divider circuit 20 shown in FIG. 1. Voltage divider circuit 60 divides the voltage at node A (at which $V_{PP}$ appears), and can be used to generate a voltage level of approximately one-half $V_{PP}$ (as described below in more detail).

As depicted, voltage divider circuit 60 comprises a plurality of capacitors 62, 64, and 66 coupled in series between node A and a node H. Capacitors 62, 64, and 66 have respective values of "C1a," "C1b," and "C2." A first tap point terminal is located between capacitors 64 and 66, and a second tap point terminal is located between capacitors 62 and 64. At the first tap point terminal, voltage divider circuit 60 can be connected to comparator circuit 16 (FIG. 1).

A current source 68, coupled between capacitor 66 and ground, outputs current $I_{pulldown}$ which pulls down the voltage at node H. An n-type transistor 70 is coupled at its drain to node A, at its gate to the second tap point terminal, and at its source to a node I. At node I, the voltage value of approximately one-half $V_{PP}$ can be generated by voltage divider circuit 60. A switch 72 can be closed to connect node I to ground.

In operation, when charge pump system 2 is active, switch 72 is open so that node I "floats." The voltage at the first tap point terminal is maintained at approximately the value of the reference voltage ($V_{ref}$). The voltage at the second tap point terminal is a divided or scaled-down replica of $V_{PP}$. This voltage appears at the gate of transistor 70 which functions as a source follower. Transistor 70 translates the voltage at the second tap point to a voltage of approximately one-half $V_{PP}$ at node I.

One purpose for generating a voltage of approximately one-half $V_{PP}$ is as follows. Some semiconductor technologies employ p-type transistors incapable of withstanding drain-to-source voltages as high as $V_{PP}$. In such case, two p-type transistors are used. The p-type transistors are connected in series as an upper transistor and a lower transistor. The upper transistor, with its source and its N-well substrate connected to $V_{PP}$, is the active switching transistor. The lower transistor has a separate N-well substrate connected to its source. The gate of the lower transistor is connected to a non-switching bias voltage equal to approximately one-half $V_{PP}$ voltage so that its source and substrate can rise no higher than a p-channel threshold above the half-$V_{PP}$ voltage level. Accordingly, neither transistor is required to support a voltage of more than one-half $V_{PP}$.

With many previously developed techniques, the half-$V_{PP}$ bias voltage is derived from $V_{PP}$ using a resistive divider. Such resistive divider may be implemented with linear resistors or stacked, diode-connected transistors. In either case, the resistive divider draws quasi-static current ($I_{PP}$) from $V_{PP}$. Because charge-pump efficiency ($I_{PP}/I_{DD}$) inherently is low, current drain $I_{DD}$ from supply voltage $V_{DD}$ is significantly increased.

In contrast to previous techniques, voltage divider circuit 60 depicted in FIG. 4 provides a one-half $V_{PP}$ voltage with no $I_{PP}$ current demand. With the capacitor divider of capacitors 62, 64, and 66, the second tap point terminal can be used as the input to the source follower (comprising transistor 70) powered by $V_{PP}$. The output of the source follower then provides a voltage of approximately one-half $V_{PP}$. No pulldown is required for the source follower as $V_{PP}$ rises, and hence it draws no current from $V_{PP}$. Node I is pulled to ground when charge pump system 2 is not active. Thus, a voltage value of one-half $V_{PP}$ is made available with no current drain on $V_{PP}$.

Switch Circuit and Comparator Circuit

Figure 5:
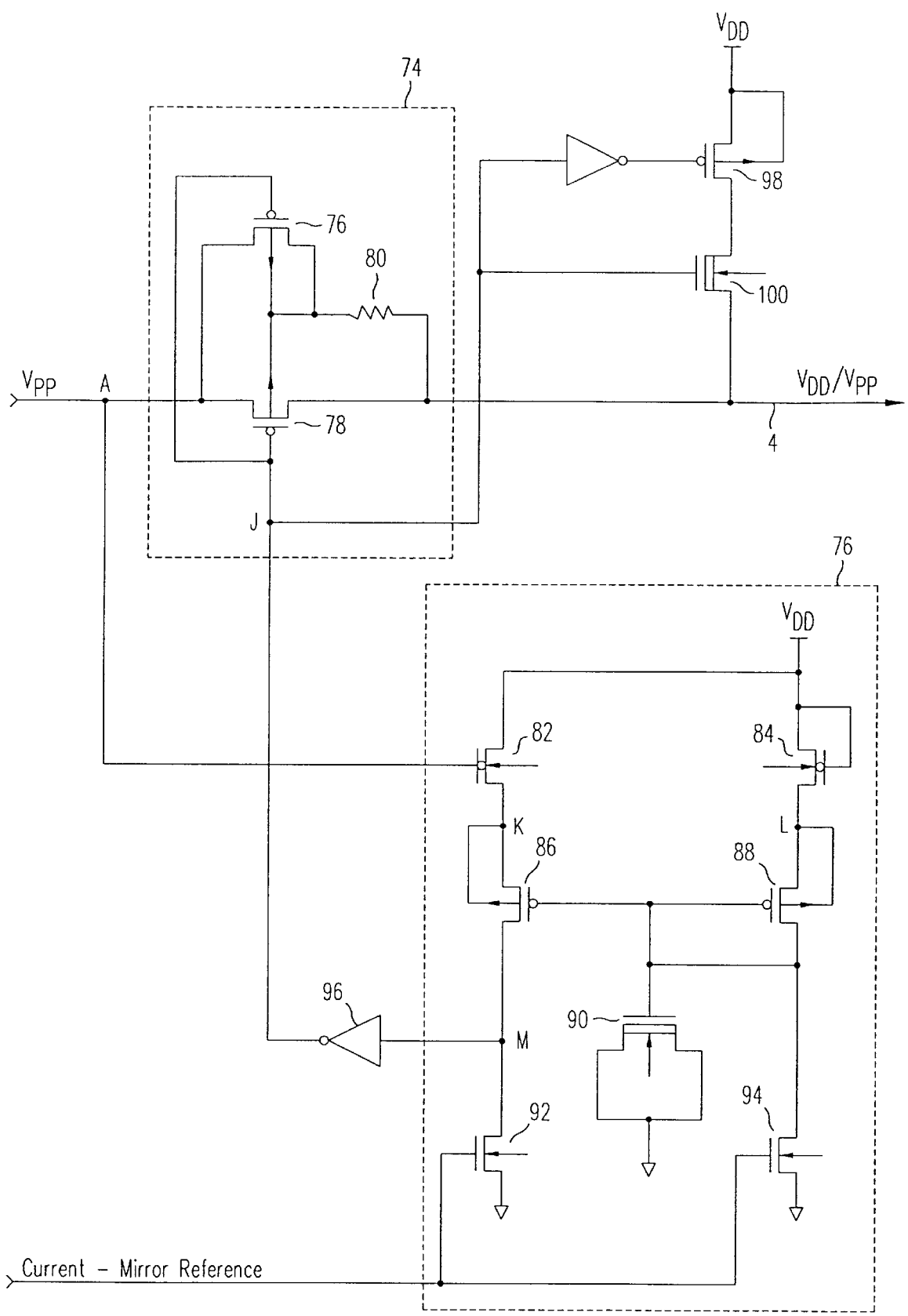
FIG. 5 is a schematic diagram of an exemplary embodiment for a switch circuit and a comparator circuit, in accordance with an embodiment of the present invention.

FIG. 5 is a schematic diagram of an exemplary embodiment for a switch circuit 74 and a comparator circuit 76, in accordance with an embodiment of the present invention. Switch circuit 74 and comparator circuit 76 can be used to implement the switching function of switches 6 and 8 of charge pump system 2.

Switch circuit 74 enables node A (at which $V_{PP}$ appears) to be at ground potential and $V_{DD}/V_{PP}$ bus 4 to be at $V_{DD}$ potential during standby position (and at the beginning of active position). Switch circuit 74 comprises a first p-type transistor 77 and a second p-type transistor 78, the gates of which are coupled together at a node J. One end of each of transistors 77 and 78 is coupled to node A; the opposing end of transistor 78 is coupled directly to $V_{DD}/V_{PP}$ bus 4, and the opposing end of transistor 77 is coupled through a resistor 80 to $V_{DD}/V_{PP}$ bus 4.

Comparator circuit 76 compares the voltage value of $V_{PP}$ at node A against the voltage value of supply $V_{DD}$. Comparator circuit 76 comprises n-type transistors 82 and 84. $V_{PP}$ is applied at the gate of transistor 82, and $V_{DD}$ is applied at the gate of transistor 84. The drains of transistors 82 and 84 are connected to $V_{DD}$. The sources of transistors 82 and 84 are connected to the sources of p-type transistors 86 and 88 at nodes K and L, respectively. In this arrangement, transistors 82 and 84 operate as source followers. That is, the voltage at node K follows $V_{PP}$, and the voltage at node L follows $V_{DD}$. The gates of transistors 86 and 88 are connected together, and coupled to the drain of transistor 88. As such, transistors 86 and 88 implement a current mirror. The drains of transistors 86 and 88 are connected to the drains of n-type transistors 92 and 94, respectively. The dimensions for transistors 92 and 94 can be selected so that the current which flows through transistor 86 is somewhat larger than (e.g., twice) that which flows through transistor 88. The sources of transistors 92 and 94 are connected to ground, and the gates of these transistors receive a current-mirror reference voltage. The gate of an n-type transistor 90 is connected to the gates of transistors 86 and 88. The source and drain of transistor 90 are connected to ground. Transistor 90 serves as a capacitor, helping to hold the voltage constant at the gate of transistor 86.

An inverter 96 is coupled at its input terminal (at a node M) to comparator circuit 76. The output terminal of inverter 96 is connected to node J so that the inverter output is applied to the gates of transistors 77 and 78 of switch circuit 74.

In operation, switch circuit 74 allows the voltage $V_{PP}$ at node A to be at ground potential in standby (as required by charge pump system 2 of FIG. 1) while connecting $V_{DD}/V_{PP}$ bus 4 to $V_{DD}$ at that time. In particular, when the charge pump system 2 is turned off (i.e., switched from active position to standby position), a path is established to pull the pump output at node A to ground at a designed rate of decline. $V_{DD}/V_{PP}$ bus 4 is connected to node A, and accordingly, is discharged. When the voltage potential of $V_{DD}/V_{PP}$ bus 4 reaches $V_{DD}$, switch circuit 74 opens the path between node A and $V_{DD}/V_{PP}$ bus 4 and substitutes a path to $V_{DD}$ via transistors 98 and 100.

In operation for comparator circuit 76, if $V_{PP}$ is equal to $V_{DD}$, which is approximately the trip point for comparator circuit 76, then the voltages at nodes K and L will be approximately equal. If transistors 86 and 88 are equal in size and the current which flows through transistor 86 is twice as large as the current which flows through transistor 88, the voltage at node M is pulled to ground. On the other hand, if $V_{PP}$ is greater than $V_{DD}$, the voltage at node K will be greater than the voltage at node L. Transistor 86 can conduct more current because its source is being held higher. This causes the voltage at node M to go to a high value. As described herein, comparator circuit 76 operates without drawing current from $V_{DD}/V_{PP}$ bus 4.

The embodiments of the present invention described herein minimize or reduce current drain in a charge pump system which outputs a high voltage $V_{PP}$. With these embodiments, a total supply current ($I_{DD}$) of less than 50 uA is required. Accordingly, the present invention provides a distinct technical advantage over previously developed techniques and systems.

While particular embodiments of the present invention have been shown and described, it will be obvious to those skilled in the art that changes and modifications may be made without departing from this invention in its broader aspects and, therefore, the appending claims are to encompass within their scope all such changes and modifications as fall within the true spirit and scope of this invention.

What is claimed is:

1. A comparator circuit comprising:
   a first source follower which follows a supply voltage $V_{DD}$;
   a second source follower which follows a high voltage $V_{PP}$, wherein a maximum value of the high voltage $V_{pp}$ is greater than a maximum value of the supply voltage $V_{dd}$; and
   a current mirror coupled to the first and second source followers, the current mirror for pulling the voltage at a node to a first value if the high voltage $V_{PP}$ is approximately equal to the supply voltage $V_{DD}$, the current mirror for pulling the voltage at the node to a second value if the high voltage $V_{PP}$ is greater than the supply voltage $V_{DD}$, thereby comparing the high voltage $V_{PP}$ to the supply voltage $V_{DD}$ without drawing current from the high voltage $V_{PP}$.

2. The comparator circuit of claim 1 wherein each of the first and second source followers comprises an n-type transistor.

3. The comparator circuit of claim 1 wherein the current mirror comprises two p-type transistors.

4. The comparator circuit of claim 1 further comprising:
   a first transistor coupled to one branch of the current mirror;
   a second transistor coupled to another branch of the current mirror; and
   the first and second transistors having dimensions such that current flowing through the first transistor is larger than that flowing through the second transistor.

5. The comparator circuit of claim 1 wherein the first value is approximately ground.

6. The comparator circuit of claim 1 wherein the second value is a high value.

7. A method comprising:
   following a supply voltage $V_{DD}$;
   following a high voltage $V_{PP}$, wherein a maximum value of the high voltage $V_{pp}$ is greater than a maximum value of the supply voltage $V_{dd}$; and
   pulling the voltage at a node to a first value if the high voltage $V_{PP}$ is approximately equal to the supply voltage $V_{DD}$, and pulling the voltage at the node to a second value if the high voltage $V_{PP}$ is greater than the supply voltage $V_{DD}$, thereby comparing the high voltage $V_{PP}$ to the supply voltage $V_{DD}$ without drawing current from the high voltage $V_{PP}$.

8. The method of claim 7 wherein following the supply voltage $V_{DD}$ comprises following with a first n-type transistor and following the high voltage $V_{PP}$ comprises following with a second n-type transistor.

9. The method of claim 7 wherein pulling the voltage at the node comprises mirroring a current.

10. The method of claim 7 wherein the first value is approximately ground.

11. The method of claim 7 wherein the second value is a high value.

12. A comparator circuit comprising:
- a first source follower which follows a supply voltage $V_{DD}$;
- a second source follower which follows a high voltage $V_{PP}$, wherein a maximum value of the high voltage $V_{PP}$ is greater than a maximum value of the supply voltage $V_{dd}$;
- a current mirror coupled to the first and second source followers, the current mirror for pulling the voltage at a node to a first value if the high voltage $V_{PP}$ is approximately equal to the supply voltage $V_{DD}$, the current mirror for pulling the voltage at the node to a second value if the high voltage $V_{PP}$ is greater than the supply voltage $V_{DD}$, thereby comparing the high voltage $V_{PP}$ to the supply voltage $V_{DD}$ without drawing current from the high voltage $V_{PP}$;
- a first transistor coupled to one branch of the current mirror; and
- a second transistor coupled to another branch of the current mirror, wherein the first and second transistors have dimensions such that current flowing through the first transistor is larger than that flowing through the second transistor.

13. The comparator circuit of claim 12 wherein each of the first and second source followers comprises an n-type transistor.

14. The comparator circuit of claim 12 wherein the current mirror comprises two p-type transistors.

15. The comparator circuit of claim 12 wherein the first value is approximately ground.

16. The comparator circuit of claim 12 wherein the second value is a high value.

17. A comparator circuit comprising:
- a first source follower which follows a supply voltage $V_{DD}$;
- a second source follower which follows a high voltage $V_{PP}$, wherein the high voltage $V_{PP}$ can reach a voltage level that is greater than the supply voltage $V_{DD}$;
- a current mirror coupled to the first and second source followers;
- a first transistor coupled to one branch of the current mirror; and
- a second transistor coupled to another branch of the current mirror, wherein the first and second transistors have dimensions such that current flowing through the first transistor is larger than that flowing through the second transistor.

18. The comparator circuit of claim 17 wherein each of the first and second source followers comprises an n-type transistor.

19. The comparator circuit of claim 17 wherein the current mirror comprises two p-type transistors.

20. The comparator circuit of claim 17 wherein the first value is approximately ground.

21. The comparator circuit of claim 17 wherein the second value is a high value.

22. The comparator circuit of claim 17 wherein the current mirror is operable to pull a voltage at a node to a first value if the high voltage $V_{PP}$ is approximately equal to the supply voltage $V_{DD}$.

* * * * *